US006843937B1

(12) United States Patent
Kiguchi et al.

(10) Patent No.: US 6,843,937 B1
(45) Date of Patent: Jan. 18, 2005

(54) COMPOSITION FOR AN ORGANIC EL ELEMENT AND METHOD OF MANUFACTURING THE ORGANIC EL ELEMENT

(75) Inventors: Hiroshi Kiguchi, Suwa (JP); Sadao Kanbe, Suwa (JP); Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/111,482

(22) Filed: Jul. 8, 1998

(30) Foreign Application Priority Data

Jul. 16, 1997 (JP) .............................................. 9-191681
Jul. 30, 1997 (JP) .............................................. 9-204697

(51) Int. Cl.$^7$ .......................... C09K 11/06; B05D 5/06; H05B 33/10

(52) U.S. Cl. ............................ 252/301.16; 252/301.35; 106/31.32; 347/100; 427/66; 428/690; 428/917

(58) Field of Search ........................ 252/301.16, 301.35; 106/31.15, 31.32; 428/690, 917; 313/504, 506; 347/95, 100; 427/66

(56) References Cited

U.S. PATENT DOCUMENTS

| 5,132,248 | A |   | 7/1992 | Drummond et al. |
| 5,214,350 | A |   | 5/1993 | Remec et al. |
| 5,276,380 | A |   | 1/1994 | Tang ........................... 313/504 |
| 5,281,489 | A | * | 1/1994 | Mori et al. ................... 428/690 |
| 5,317,169 | A | * | 5/1994 | Nakano et al. ................ 257/40 |
| 5,326,692 | A |   | 7/1994 | Brinkley et al. |
| 5,540,999 | A | * | 7/1996 | Yamamoto et al. ....... 428/411.1 |
| 5,593,788 | A |   | 1/1997 | Shi et al. ..................... 428/690 |
| 5,610,932 | A |   | 3/1997 | Kessler et al. |
| 5,665,857 | A |   | 9/1997 | Shi ............................. 528/373 |
| 5,821,002 | A | * | 10/1998 | Ohnishi et al. ............. 428/690 |
| 5,854,139 | A |   | 12/1998 | Aratani et al. |
| 6,008,828 | A | * | 12/1999 | Furuki et al. ................ 347/139 |
| 6,013,982 | A |   | 1/2000 | Thompson et al. ......... 313/506 |
| 2001/0001050 | A1 | * | 5/2001 | Miyashita et al. .......... 428/690 |

FOREIGN PATENT DOCUMENTS

| EP | 0 756 932 A2 | 2/1997 |
| GB | 2 292 947 A | 3/1996 |
| JP | A-62-31174 | 2/1987 |
| JP | A-62-85224 | 4/1987 |
| WO | WO 90/13148 | 11/1990 |
| WO | WO 94/15441 | 7/1994 |
| WO | WO 95/01871 | 1/1995 |
| WO | WO 98/24271 | * 6/1998 |
| WO | WO 98/32783 | * 7/1998 |

OTHER PUBLICATIONS

Lewis, Richard J., *Hawley's Condensed Chemical Dictionary*, Thirteenth Edition, 1997, pp. 820 & 900–901, (no month).

Morrison, Robert et al., *Organic Chemistry*, Fifth Edition, 1987, p. 637, (no month).
Budavari, Susan et al., *The Merck Index An Encyclopedia of Chemicals, Drugs, and Biologicals*, Twelfth Edition, 1996, p. 357, (no month).
Adachi, Chihaya et al., "Blue light–emitting organic electroluminescent devices", *Appl. Phys. Lett.*, vol. 56, No. 9, Feb. 26, 1990, pp. 799–801.
Burrows, P.E. et al., "Color–tunable organic light–emitting devices", *Appl. Phys. Lett.*, vol. 69, No. 20, Nov. 11, 1996, pp. 2959–2961.
Kido, J. et al., "Single–layer white light–emitting organic electroluminescent devices based on dye–dispersed poly(N–vinylcarbazole)", *Appl. Phys. Lett.*, vol. 67, No. 16, Oct. 16, 1995, pp. 2281–2283.
Wu, C.C. et al., "Integrated three–color organic light–emitting devices", *Appl. Phys. Lett.*, vol. 69, No. 21, Nov. 18, 1996, pp. 3117–3119.
Zhang, C. et al., "Blue emission from polymer light–emitting diodes using non–conjugated polymer blends with air–stable electrodes", *Synthetic Metals*, vol. 72, 1995, pp. 185–188, (no month).
Ishimaru, N. et al., Development of Color Filters by Pigment Ink Jet Printing (II) (–Production Technology–), *SID*, 1997, pp. 69–72, (no month).
Ebisawa, F. et al., "Electrical Properties of polyacetylene/polysiloxane interface", *J. Appl. Phys.*, vol. 54, No. 6, Jun. 1983, pp. 3255, 3258, 3259.
Kido, Junji et al., "Organic electroluminscent devices based on molecularly doped polymers", *Appl. Phys. Lett.*, vol. 61, No. 7, Aug. 17, 1992, pp. 761–763.
Van Slyke, S.A. et al., "Organic electroluminescent devices with improved stability", *Appl. Phys. Lett.*, vol. 69, No. 15, Oct. 7, 1996, pp. 2160–2162.

(List continued on next page.)

*Primary Examiner*—Marie Yamnitzky
(74) *Attorney, Agent, or Firm*—Oliff & Berridge, PLC

(57) ABSTRACT

A composition for an organic EL element which can form a high precision pattern in a simple manner and in a short time and a method of manufacturing the organic EL element are disclosed. By using the composition, optimum film design and luminescence characteristic can be easily obtained, and an adjustment of a luminescence efficiency can also be easily performed. The composition for an organic EL element comprises a precursor of a conjugated organic polymer compound for forming at least one luminescent layer (106), (107), (108) having a certain color and at least one kind of fluorescent dye for changing the luminescence characteristic of the luminescent layer. The luminescent layer is made from a pattern formed by an ink-jet method. As for the precursor, a precursor of PPV, PPV derivative or the like is preferably used. Further, it is preferable that the composition for the organic EL element satisfies at least one of the conditions including a contact angle of 30 to 170 degrees with respect to a nozzle surface of a nozzle provided in a head of an ink-jet device used for the ink-jet method for discharging the composition, a viscosity of 1 to 20 cp and a surface tension of 20 to 70 dyne/cm.

28 Claims, 4 Drawing Sheets

OTHER PUBLICATIONS

Zhang, C. et al., "Blue electroluminescent diodes utilizing blends of poly(p–phenylphenylene vinylene) in poly(9–vinylcarbazole)", *Synthetic Metals,* vol. 62, 1994, pp. 35–40, (no month).

Vestweber, H. et al., "Electroluminescence from polymer blends and molecularly doped polymers", *Synthetic Metals,* vol. 64, 1994, pp. 141–145, (no month).

Nonaka, Y. et al., "Development of Color Filters by Pigment Ink Jet Printing (1) (Fundamental Technology)", *SID,* 1997, pp. 238–241, (no month).

Wu, Chung–Chih et al., "Efficient Organic Electroluminescent Devices Using Single–Layer Doped Polymer Thin Films with Bipolar Carrier Transport Abilities", *IEEE Transactions on Electron Devices,* vol. 44, No. 8, Aug. 1997, pp. 1269–1281.

Wu, C.C. et al., "Surface modification of indium tin oxide by plasma treatment: An effective method to improve the efficiency, brightness, and reliability of organic light emitting devices", *Appl. Phys. Lett.,* vol. 70, No. 11, Mar. 17, 1997, pp. 1348–1350.

Tian, Jing et al., "Luminescent Properties of Conjugated Poly(p–pyridylvinylene) and Poly(p–pyridiniumvinylene)", *Polymer Preprints,* vol. 35, No. 2, Aug. 1994, pp. 761–762.

Marsells, Michael J. et al. "Regiochemical Consequences in Poly(2,5–Pyridinium Vinylene): Kekule' and Non–Kekule' Conductive Polymers", *Polymer Preprints,* vol. 33, No. 1, Apr. 1992, pp. 1196–1197.

Hosokawa, Chishio et al., "Highly efficient blue electroluminescence from a distyrylarylene emitting layer with a new dopant", *Appl. Phys. Lett.,* vol. 67, No. 26, Dec. 25, 1995, pp. 3853–3855.

Hebner, T.R. et al. "Ink–jet printing of doped polymers for organic light emitting devices", *Appl. Phys. Lett.,* vol. 72, No. 5, Feb. 2, 1998, pp. 519–521.

Mayo, Jonathan W. et al., "16.3: Colour Filters for Flat Panel Displays by High Definition Ink Jet Printing", *Euro Display '96,* Oct. 1–3, 1996, pp. 537–540.

Parker, I.D. et al., "Efficient blue electroluminescence from a fluorinated polyquinoline", *Appl. Phys. Lett.,* vol. 65, No. 10, Sep. 5, 1994, pp. 1272–1274.

Tian, Jing et al., "Photophysical Properties, Self–Assembled Thin Films, and Light–Emitting Diodes of Poly(p–pyridylvinylene)s and Poly(p–pyridinium vinylene)s", *Chem. Mater.,* vol. 7, No. 11, 1995, pp. 2190–2198, (no month).

Tian, Jing et al., "Electroluminescent Properties of Self–Assembled Polymer Thin Films", *Adv. Mater.,* vol. 7, No. 4, 1995, pp. 395–398, (no month).

Johnson, G.E. et al., "Electroluminescence from single layer molecularly doped polymer films", *Pure & Appl. Chem.,* vol. 67, No. 1, 1995, pp. 175–182, (no month).

Uchida et al, "Color–variable light–emitting diode utilizing conducting polymer containing fluorescent dye", *STN Chemical Abstracts,* vol. 16, No. 119, Oct. 18, 1993, XP–002078807.

M. Uchida et al., *Color–Variable Light–Emitting Dioide Utilizing Conducting Polymer Containing Fluorescent Dye,* Jpn. J. Appl. Phys., Part 2, (Chemical Abstract, vol. 119, No. 16), (1993), (no month).

* cited by examiner

COMPOSITION FOR AN ORGANIC EL ELEMENT AND METHOD OF MANUFACTURING THE ORGANIC EL ELEMENT

BACKGROUND OF THE INVENTION

1. Field of the Invention

The present invention relates to a composition for an electroluminescent (EL) element, and more particularly to a composition for an organic EL element, and a method of manufacturing the organic EL element.

2. Description of the Background Art

An organic EL element has a constitution in which a cathode and an anode are connected to the opposite sides of a solid thin film containing a fluorescent organic compound. When a voltage is applied across the electrodes, electrons and holes are injected into the thin film, and they migrate according to the generated electric field and recombine with each other. At the time, excitons are produced by the energy liberated upon the recombination, and energy (in the form of fluorescence or phosphorescence) is emitted when the excitons are returned to the ground state thereof. This phenomenon is called electroluminescence.

The characteristic of an organic EL element resides in the point that a high luminance surface emission of 100 to 100,000 $cd/m^2$ is possible at a low voltage of less than about 10V. Further, since organic compounds are used, there is an unlimited possibility as to the selection of the raw materials. This is the excellent advantage of the EL element, which cannot be found in other material systems. For example, by appropriate selection of the kinds of the fluorescent materials, it is possible to provide emission of visible rays ranging from blue color to red color.

In this connection, the luminescence efficiency and the stability of the EL element which are important factors of the EL element are achieved by a luminescent layer. In the past, doping of high efficiency fluorescent dyes into the luminescent layer has been carried out in order to improve the luminescence efficiency and change the emission wavelength.

The conventional organic EL element is formed into a thin film laminated-type organic thin film EL element, in which a low molecular material (host material) is mainly used as an organic EL material so that the thin film is formed of the low molecular material. Such an organic EL material is formed by adding a fluorescent dye to a low molecular weight host material. Examples of such an EL element include an element obtained by adding a fluorescent dye such as perylene or distyrylbiphenyl to a host material such as aluminum quinolynol complex ($Alq_3$) or distyrylbiphenyl or the like.

In order to form a thin film from such a low molecular dye compound, a vapor deposition method has been so far employed. However, it is difficult to obtain a homogeneous defect-free thin film by the vapor deposition method. Further, the vapor deposition is not an efficient method, since it takes a long time to form several organic layers by the method.

SUMMARY OF THE INVENTION

It is an object of the present invention to provide a composition for an organic EL element and a method of manufacturing such an EL element which can perform a high precision patterning in a simple manner and in a short time, achieve an optimization of a film design and a luminescence characteristic easily, and facilitate an adjustment of a luminescence efficiency, as well as form a thin film having excellent durability.

In order to achieve such an object, the present invention is directed to a composition for an organic EL element for forming at least one luminescent layer having a certain color. The composition comprises a precursor of a conjugated organic polymer compound for forming the luminescent layer; and at least one kind of fluorescent dye for changing the luminescence characteristic of the luminescent layer. Preferably, the luminescent layer is made from a pattern of the composition which is formed by an ink-jet method. In this case, the luminescence characteristic is a maximum wavelength of light absorption, and it is preferred that the conjugated organic polymer compound includes a hole injection and transfer type material.

The precursor is preferably a polyarylene vinylene precursor, and more preferably a precursor of a polyparaphenylene vinylene or a polyparaphenylene vinylene derivative.

The fluorescent dye is preferably at least one selected from rhodamine or rhodamine derivative, distyrylbiphenyl or distyrylbiphenyl derivative, coumarin or coumarin derivative, tetraphenylbutadiene (TPB) or tetraphenylbutadiene derivative, and quinacridone or quinacridone derivative. In this case, the amount of the fluorescent dye to be added is preferably 0.5 to 10 wt % with respect to a solid component of the precursor of the conjugated organic polymer compound.

Further, it is preferred that the precursor of the conjugated organic polymer compound and the fluorescent dye exist in the state of being dissolved or dispersed into a polar solvent. Further, it is also preferred that a wetting agent is contained in the composition.

Furthermore, it is preferred that the composition for the organic EL element satisfies at least one of the conditions including a contact angle of 30 to 170 degrees with respect to a material constituting a nozzle surface of a nozzle provided in a head of a device used for an ink-jet method for discharging the composition, a viscosity of 1 to 20 cp and a surface tension of 20 to 70 dyne/cm.

The composition for the organic EL element according to the present invention is used for a pattern formation for the luminescent layer, and the pattern formation is carried out by the ink-jet method, wherein the composition has a contact angle of 30 to 170 degrees with respect to a material constituting a nozzle surface of a nozzle provided in a head of an ink-jet device for discharging the composition.

Further, the present invention is also directed to a method of manufacturing the organic EL element. The method comprises the steps of coating a pattern by discharging a composition for an organic EL element containing a precursor of a conjugated organic polymer compound from a head by an ink-jet method, and forming at least one luminescent layer for a certain color by conjugating the precursor of the conjugated organic polymer compound.

In this method, it is preferred that the composition further includes at least one kind of luminescent dye for changing a luminescence characteristic of the luminescent layer. In this case, the luminescence characteristic is a maximum wavelength of light absorption.

Further, it is preferred that the conjugated organic polymer compound includes a hole injection type material. Further, it is also preferred that the precursor of the conjugated organic polymer compound includes a precursor of a polyarylene vinylene, and more preferably a precursor of a polyparaphenylene vinylene or a polyparaphenylene vinylene derivative.

The fluorescent dye is preferably at least one selected from rhodamine or rhodamine derivative, distyrylbiphenyl or distyrylbiphenyl derivative, coumarin or coumarin derivative, tetraphenylbutadiene (TPB) or tetraphenylbutadiene derivative, and quinacridone or quinacridone derivative.

Further, it is preferred that the composition for the organic EL element satisfies at least one of the conditions including a contact angle of 30 to 170 degrees with respect to a nozzle surface of a nozzle provided in a head of a device used for the ink-jet method for discharging the composition, a viscosity of 1 to 20 cp and a surface tension of 20 to 70 dyne/cm.

PREFERRED EMBODIMENTS OF THE INVENTION

Figure 1:
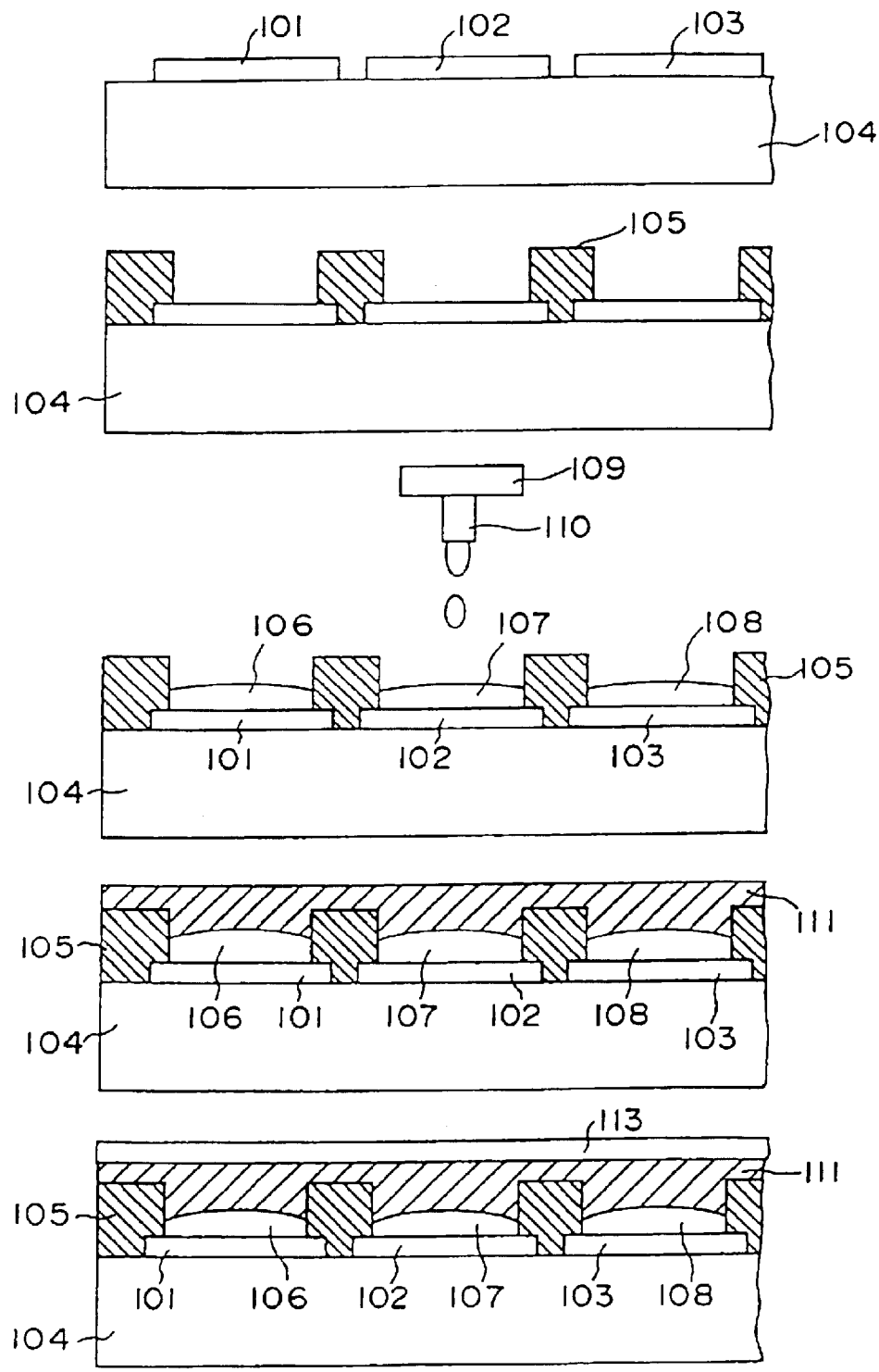
FIG. 1 is a sectional view which shows steps performed in the manufacturing method of the present invention.

Hereinbelow, a composition for an organic EL element (hereinafter, referred to as "composition") and a method of manufacturing the organic EL element according to the present invention will be described in detail based on the preferred embodiments shown in the accompanying drawings.

The composition for the organic EL element of the present invention is used to form at least one luminescent layer having a certain color, and the luminescent layer is formed from a pattern of the composition which is formed by the ink-jet method. The composition for the organic EL element includes as its main component a precursor of a conjugated organic polymer compound (hereinafter, referred to as "precursor") for forming the luminescent layer and at least one kind of fluorescent dye for changing the emission characteristic of the luminescent layer.

Here, the precursor means a material which coated for pattern formation as a composition for the organic EL together with a fluorescent dye and then conjugated by heating or the like as shown, for example, by the following chemical formula (I) thereby producing a conjugated organic polymer EL layer. For example, when the precursor is a sulfonium salt, an elimination of the sulfonium group is caused by a heat treatment so that the precursor is turned into the conjugated organic polymer compound.

[Chemical Formula (I)]

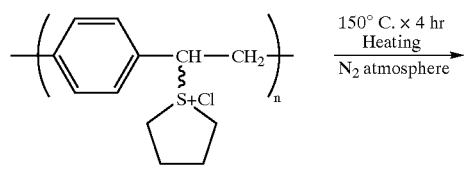

150° C. × 4 hr
Heating
N₂ atmosphere

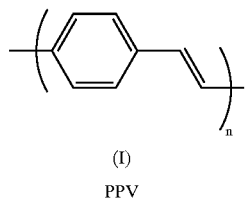

(I)
PPV

Such a conjugated organic polymer compound exhibits a strong fluorescence in the solid state, and is capable of forming a homogeneous and stable solid super thin film.

Further, the conjugated organic polymer compound has an excellent formability, and has a high adhesion to an ITO electrode. In addition, such a precursor can form a sturdy conjugated polymer film after hardening. Further, since the precursor is used in the form of a precursor solution before hardening, it is possible to adjust its concentration or the like easily, thereby enabling to obtain a coating liquid suitable for ink-jet pattern formation as will be described later. This means that it is possible to set the optimum conditions for the thin film easily in a short time and to form the thin film based on the conditions.

It is preferred that the conjugated organic polymer compound is a hole injection and transfer type material. With this choice, it is possible to promote the injection and transfer of the carriers, and improve the luminescence efficiency.

As for example of the precursor of such a conjugated organic polymer compound, a polyarylene vinylene precursor is preferable. Since the polyarylene vinylene precursor is soluble to a water-based solvent or an organic solvent, it is possible to prepare easily the composition for the organic EL element. Further, since such a precursor can be polymerized under certain conditions, it is possible to obtain a thin film having high optical quality.

Examples of such a polyarylene vinylene precursor include: precursor of PPV derivative such as PPV (poly (para-phenylene vinylene)) precursor, MO-PPV (poly(2,5-dimethoxy-1,4-phenylene vinylene)) precursor, CN-PPV (poly(2,5-bishexyloxy-1,4-phenylene-(1-cyanovinylene))) precursor, MEH-PPV (poly[2-methoxy-5-(2'-ethylhexyloxy)]-para-phenylene vinylene) precursor and the like; poly(alkylthiophene) precursor such as PTV (poly(2, 5-thienylene vinylene)) precursor and the like; PFV (poly (2,5-furylene vinylene)) precursor; poly(paraphenylene) precursor; and polyalkylfluorene precursor, and the like. Among these precursors, the precursor of PPV or PPV derivatives such as shown in the following chemical formula (II) is most preferable.

[Chemical Formula (II)]

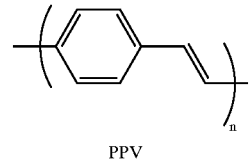

PPV

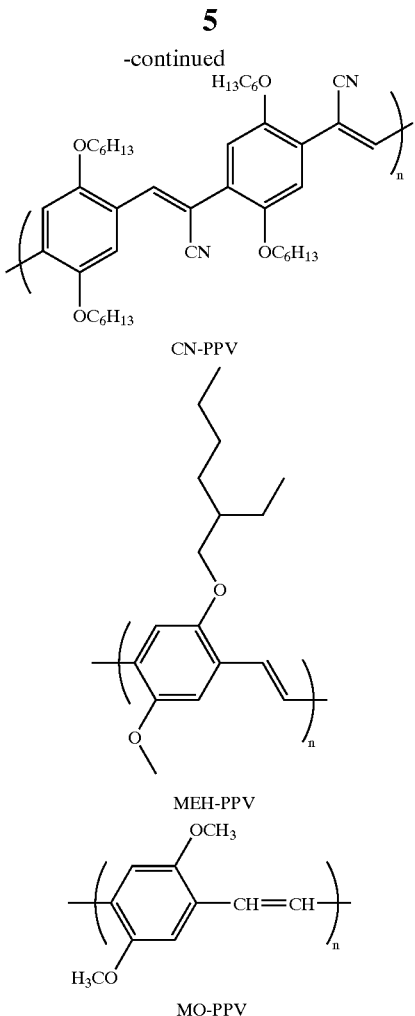

CN-PPV

MEH-PPV

MO-PPV

The precursor of PPV or the PPV derivative is soluble to water. After such a precursor solution is coated, heat treatment is carried out to conjugate the precursor, thereby forming a conjugated PPV thin film.

In the ink-jet method, it is preferable to use a composition which is soluble to water-based, alcohol-based or glycol-based solvent. Since the precursor of PPV or PPV derivative is soluble to these solvents, it is possible to avoid undesirable effect on the human body and erosion of the passage of the discharged liquid and the ink head material which would be caused when other solvent are used.

Further, since PPV and the like possess a strong fluorescence and it is a conductive polymer in which π-electron of double bond is delocalized on the polymer chain, it is possible to obtain an organic EL element having high performance.

The content of the precursor represented by the PPV precursor is preferably 0.01 to 10 wt %, and more preferably 0.1 to 5.0 wt %, with respect to the total amount of the composition for the organic EL element. If the amount of the precursor to be added is too small, it is insufficient for formation of the conjugated polymer film. On the other hand, if the amount of the precursor to be added is too much, the viscosity of the composition becomes high, which is not suitable for coating and pattern formation with high precision by the ink-jet method.

In addition, as for examples of polymer organic compound other than the PPV precursor which can form a luminescent layer, pyrazoline dimer, quinolizine carboxylic acid, benzopyrylium perchlorate, benzopyrano quinolizine, rubrene, phenanthroline europium complex and the like can be mentioned, and a composition for the organic EL element containing one of these compounds or a mixture of two or more of these compounds may also be employed.

Further, the composition for an organic EL element according to the present invention includes at least one kind of fluorescent dye in addition to the precursor of the conjugated organic polymer compound described above. In this way, it becomes possible to change the luminous property of the luminescent layer. Therefore, the addition of the fluorescent dye is effective as a means, for example, for improving the luminous efficiency of the luminescent layer or for changing the maximum wavelength of light absorption (emitted color) of the luminescent layers.

Namely, a fluorescent dye can be utilized not only as a material for the luminescent layers but also as a material for the coloring matter which exhibits the luminescence function by itself. This is because almost all of the energy of the excitons which are generated by the recombination of carriers on the molecules of a conjugated organic polymer compound can be transferred onto the molecules of the fluorescent dye. In this case, the current quantum efficiency of the EL element is also increased, because the luminescence arises only from the molecules of the fluorescent dye which have a high fluorescence quantum efficiency. Accordingly, by the addition of a fluorescent dye into the composition for the organic EL element, the luminescence spectrum of the luminescent layer becomes the spectrum of the fluorescent dye, thereby enabling to change the emitted color.

In this connection, it should be noted that what is meant here by the current quantum efficiency is a scale for considering the luminescence performance according to the luminescence function, and it is defined by the following expression.

$\eta_E$=energy of emitted photon/inputted electrical energy

In this way, by changing the maximum wavelength of light absorption by the doping of an appropriate fluorescent dye, it becomes possible, for example, to emit the three primary colors of red, green and blue, thereby enabling to obtain a full color display device.

Further, the doping of the fluorescent dye also makes it possible to improve extremely the luminous efficiency of the organic EL element.

As for a fluorescent dye used for the red luminescent layer, laser dye DCM-1, rhodamine or a rhodamine derivative, perylene and the like are preferably used. These fluorescent dyes are soluble to solvents because they are low molecules, and have a high compatibility with PPV or the like, so that a luminescent layer with a good uniformity and good stability can be formed.

As for examples of the rhodamine derivative fluorescent dyes, rhodamine B, rhodamine B base, rhodamine 6G, and rhodamine 101 perchlorate and the like can be mentioned.

Further, as for a fluorescent dye used in the green luminescent layer, quinacridone, rubrene, DCJT and their derivatives are preferably used. Since these fluorescent dyes are low molecules in the same manner as the fluorescent dyes to be used in the above-mentioned red luminescent layer, they are soluble to solvents and have a high compatibility with PPV or the like, so that the luminescent layer can be formed.

As for the fluorescent dye used in the blue luminescent layer, distyrylbiphenyl and its derivative are preferable.

These fluorescent dyes are soluble to solvents in the same manner as the above-mentioned fluorescent dyes for the red luminescent layer, and have high compatibility with PPV or the like, so that the luminescent layer can be formed.

Further, as for other fluorescent dyes for generating blue emitted color, coumarin and coumarin derivative can be mentioned. These fluorescent dyes are soluble to solvents because they are low molecules in the same manner as the above-mentioned fluorescent dyes, and have high compatibility with PPV or the like, so that the luminescent layer can be formed.

As for examples of the coumarin derivative fluorescent dyes, coumarin-1, coumarin-6, coumarin-7, coumarin 120, coumarin 138, coumarin 152, coumarin 153, coumarin 311, coumarin 314, coumarin 334, coumarin 337, coumarin 343 and the like can be mentioned.

Further, as for other fluorescent dyes (luminescent materials) for generating blue emitted color, tetraphenylbutadiene (TPB) or TPB derivative, DPVB1 and the like are preferable. Since these fluorescent dyes (luminescent materials) are also low molecules, they are soluble to solvents, and have high compatibility with PPV, so that the luminescent layer can be formed.

These fluorescent dyes and luminescent materials as described above can be selectively used alone or in the form of a mixture of two or more of them.

The amount of these fluorescent dyes to be added to the solid component of the precursor of the conjugated organic polymer compound are preferably 0.5 to 10 wt %, and more preferably 1.0 to 5.0 wt %. If the amount of the florescent dye to be added is too much, it becomes difficult to maintain the weather resistance and the durability of the luminescent layer. On the other hand, the amount of the florescent dye to be added is too little, it is impossible to obtain sufficiently the effect of adding the florescent dye.

Moreover, it is preferable that the precursor and the fluorescent dye are dissolved or dispersed into a polar solvent. Since the polar solvent is capable of readily dissolving or homogeneously dispersing the precursor and the fluorescent dye, use of the polar solvent makes it possible to prevent the solid component in the organic EL composition from being stuck at the nozzle hole of ink-jet device and to prevent the nozzle hole from being clogged with the solid component. Further, it also contributes to maintain the high contact angle of the ink at the nozzle hole. In this way, it is possible to prevent the bend in the jetted direction of the ink.

As for examples of the polar solvent, water; water compatible alcohol such as methanol, ethanol and the like; organic solvents such as N,N-dimethylformamide (DMF), N-methylpyrrolidone (NMP), dimethylimidazoline (DMI), dimethylsulfoxide (DMSO) and the like; and inorganic solvents can be mentioned. Each of these solvents can be used alone or in the form of an appropriate mixture of two or more of them.

In addition, it is preferred that a wetting agent is added in the composition for the organic EL element. With this arrangement, it is possible to prevent effectively the composition from being dried and solidified at the ink-jet nozzle hole. As for examples of such a wetting agent, polyhydric alcohols such as glycerin and diethylene glycol and the like can be mentioned. In this case, it is possible to use a mixture of two or more of them. The amount of the wetting agent to be added is preferably about 5 to 20 wt % with respect to the total amount of the composition for the organic EL element.

Moreover, other additives and film stabilizing materials may also be added. For example, stabilizer, anti-aging agent, pH adjusting agent, antiseptic agent, resin emulsion, leveling agent or the like may be added.

According to the method of manufacturing the organic EL element by the ink-jet method, the above-mentioned composition which is in the form of a discharge liquid is discharged from the head of the device used for the ink-jet method to form a pattern of at least one luminescent layer with one color selected from the thee primary colors comprising red, green and blue and their intermediate colors.

According to the ink-jet method, a fine pattern formation can be carried out simply in a short time. In addition, through adjustment of the discharging amount or the concentration of the discharge liquid, film properties such as film thickness and film area and the like, and the emission capability such as emission balance and luminance can be controlled readily and arbitrarily.

The organic EL element which is used for the pattern formation by the ink-jet method has characteristics as described below.

It is preferable that the compositions have a contact angle of 30 to 170 degrees, and more preferably, 35 to 65 degrees, with respect to the material constituting the nozzle surface of the nozzle provided in the head of the ink-jet device. When the contact angle is set to a value within this range, it is possible to carry out a precise patterning by suppressing the bend in the jetted direction of the composition.

Namely, if the contact angle is less than 30 degrees, wettability of the composition with respect to the material constituting the nozzle surface increases, so that there is a case that the composition adheres asymmetrically to the periphery of the nozzle hole at the time of discharging the composition. In this case, an attraction acts between the composition adhered to the nozzle hole and the composition to be discharged. This causes the discharge of the composition by a nonuniform force, which gives rise to a situation so-called "bend in the jetted direction" in which the composition is unable to reach the target position. Further, the occurrence frequency of the bend in the jetted direction also tends to increase. On the other hand, if the contact angle exceeds 170 degrees, the interaction between the composition and the nozzle hole becomes a minimum and the shape of the meniscus at the tip of the nozzle is unstable, so that the control of the amount and the timings of discharge of the composition becomes difficult.

In the above descriptions, what is meant here by the bend in the jetted direction refers to a situation in which, when the composition is discharged from the nozzle, the point of impact of a dot deviates from the target position by more than 50 $\mu$m. Further, the occurrence frequency of the bend in the jetted direction is defined as the time until the bend in the jetted direction occurs after a continuous discharge of the composition is started at the frequency of 7200 Hz.

The bend in the jetted direction is generated principally by such causes as the nonuniformity in the wettability of the nozzle hole and the clogging of the nozzle hole by the attachment of solid components of the composition. Such bend in the jetted direction can be eliminated by cleaning the head. In this connection, more frequent head cleaning is required for more frequency of occurrence of the bend in the jetted direction, and this causes to deteriorate the manufacturing efficiency of the EL element by the ink-jet method. On the practical level, it is preferred that an occurrence frequency of the bend in the jetted direction is more than 1000 seconds.

By preventing such bend in the jetted direction from occurring, it becomes possible to carry out a highly fine patterning efficiently with high precision.

Further, it is preferable that the viscosity of the composition is 1 to 20 cp, and more preferably 2 to 4 cp. If the viscosity of the composition is less than 1 cp, the contents of the precursor and the fluorescent dye in the material are too small, so that the luminescent layer which is formed cannot exhibit luminescence power sufficiently. On the other hand, if it exceeds 20 cp, it becomes impossible to discharge the composition smoothly from the nozzle. Further, it becomes difficult to carry out patterning unless otherwise the specification of the ink-jet device is changed, for example, by enlarging the diameter of the nozzle hole and so forth. In addition, when the viscosity of the composition is high, precipitation of the solid components in the composition tends to occur, thus leading to an increased occurrence frequency of clogging of the nozzle hole.

Furthermore, it is preferable that the composition has the surface tension of 20 to 70 dyne/cm, and more preferably 25 to 40 dyne/cm. By restricting the surface tension to such a range, it is possible to suppress the bend in the jetted direction and thereby hold the occurrence frequency of the bend in the jetted direction to a low level, in the same manner as the case of the above-mentioned contact angle. If the surface tension is less than 20 dyne/cm, the wettability of the composition with respect to the material constituting the nozzle surface increases. As a result, not only the bend in the jetted direction occurs, but also its occurrence frequency tends to increase as is discussed with reference to the case of the contact angle. On the other hand, if it exceeds 70 dyne/cm, the shape of the meniscus at the tip of the nozzle is not stable, which results in the difficulty in the control of the amount and the timings of discharge of the composition.

Further, as for the composition of the organic EL element of this invention, it is preferable to use a composition which has a characteristic that satisfies the above-mentioned numerical range for at least one of the characteristics including the contact angle, the viscosity and the surface tension described above. In this connection, it is more preferable to use a composition which has a characteristic that satisfies the above-mentioned numerical ranges for arbitrary combination of two characteristics, and it is most preferable to use a composition which has a characteristic that satisfies all the numerical ranges. These compositions are more suitable for the ink-jet method.

The method of manufacturing the organic EL element according to the present invention is characterized by including a step of coating a composition for the organic EL element primarily containing a precursor of a conjugated organic polymer compound by jetting it out from the nozzle hole of the head for the ink-jet device to form a pattern, and a step of forming a luminescent layer by conjugating the precursor of the conjugated organic polymer compound described above. As a composition for the organic EL element used in this method, the compositions for the organic EL element described above may be employed.

The precursor of the conjugated organic polymer compound is readily soluble to solvents, and has a large degrees of freedom in the selection for the contact angle, viscosity and surface tension of the jetting liquid. Accordingly, since it is possible to discharge an arbitrary amount of the composition to an arbitrary position, a precise pattern formation can be performed and the emission characteristics and the film properties of the luminescent layer can be easily controlled.

The method of conjugating the precursor of the conjugated organic polymer compound is not particularly limited, but it is preferable to be achieved by a heat treatment. In this way, the luminescent layer can be easily formed with a simple manner.

It is preferable that the composition for the organic EL element mainly contains a precursor of a conjugated oraganic polymer compound for forming a luminescent layer, and at least one kind of fluorescent dye for changing the luminescence characteristics of the luminescent layer. Since the precursor of the conjugated organic polymer compound forms a solid thin film, the fluorescent dye itself is not required to possess a thin film formation capability, so that it may be used in the form of dispersing molecules. Because of this, various fluorescent dyes can be selected widely, thereby enabling to form a desired luminescent layer.

Moreover, as for the precursor of the conjugated organic polymer compound and the fluorescent dye, those compounds described in the above may be employed.

Figure 2:
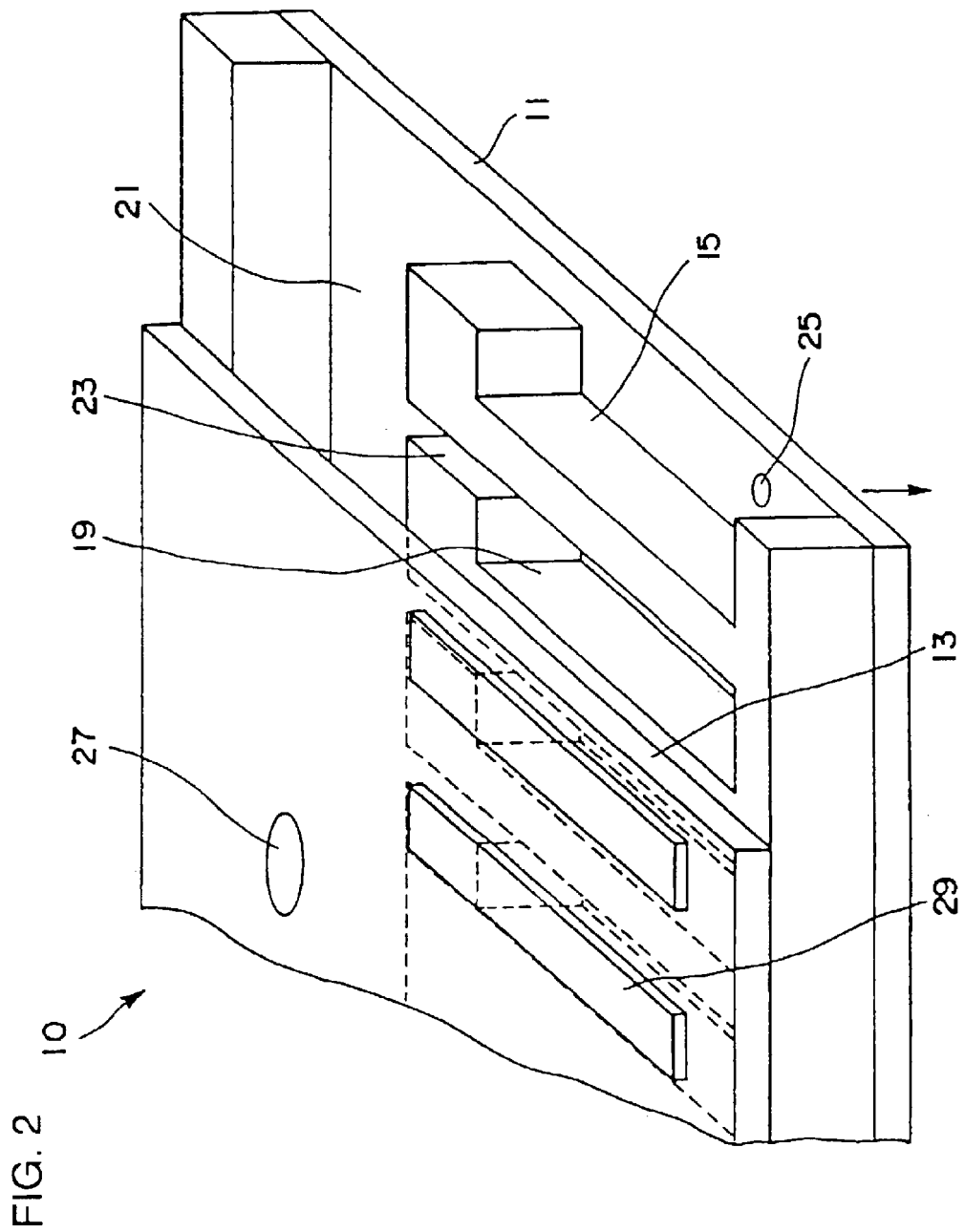
FIG. 2 is a perspective view which shows an example of a configuration of a head of an ink-jet device which is used in the manufacturing method of the present invention.
Figure 3:
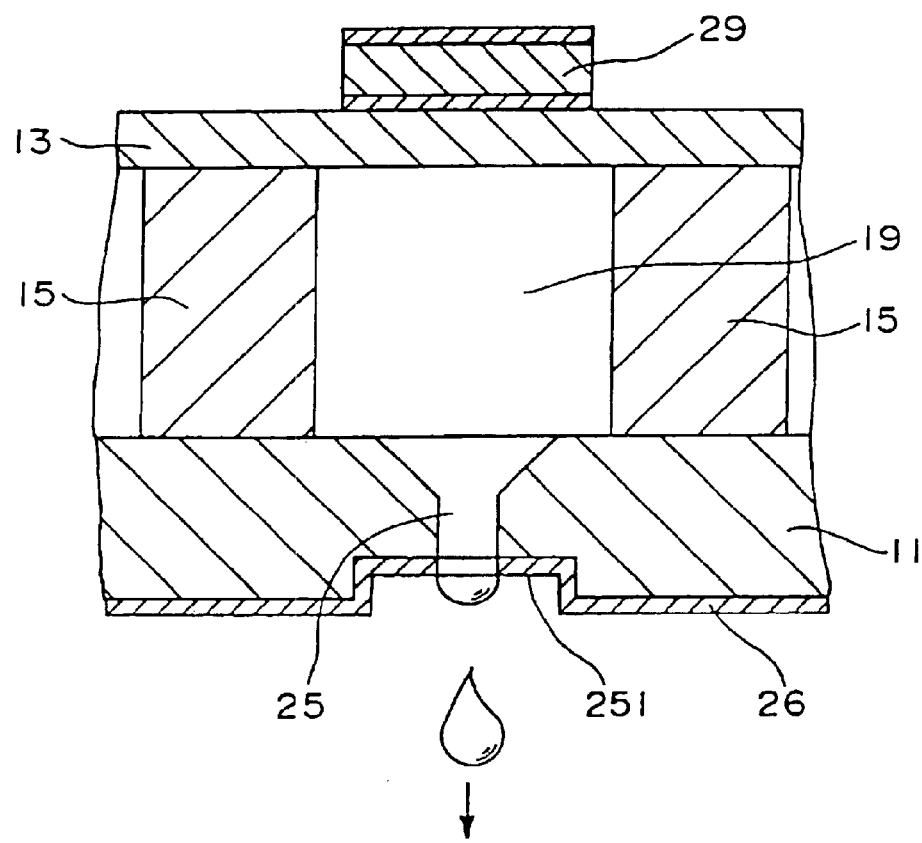
FIG. 3 is a sectional view of the nozzle part of the head of the ink-jet device shown in FIG. 2.
Figure 4:
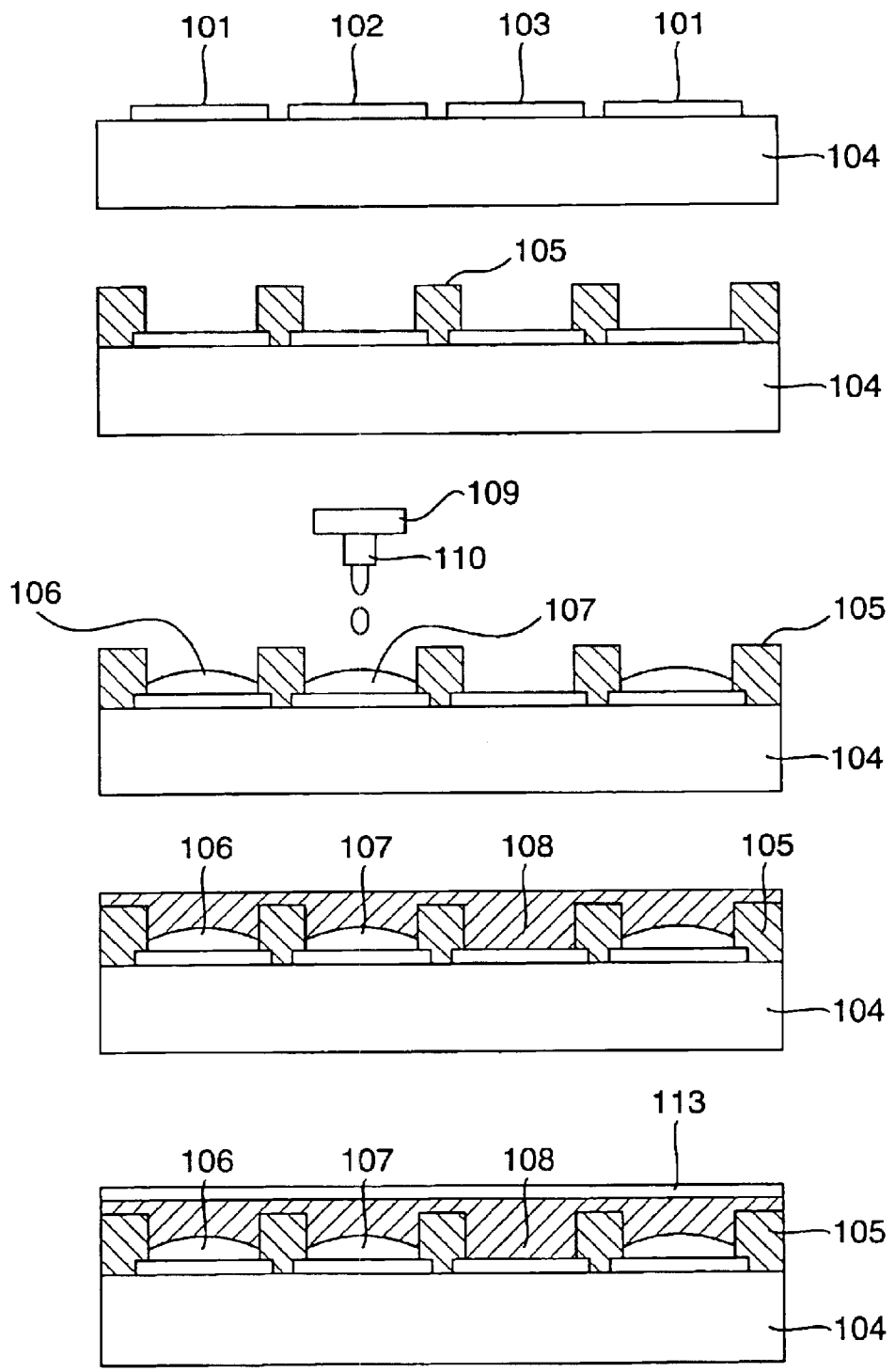
FIG. 4 is a sectional view which shows steps performed in another embodiment of the manufacturing method of the present invention.

The structure of the head of the ink-jet device used in the manufacturing method of the organic EL element according to the present invention is shown in FIG. 2.

The head 10 for the ink-jet device is provided with, for example, a stainless steel nozzle plate 11 and a vibration plate 13, and they are coupled via partitioning members (reservoir plates) 15.

Between the nozzle plate 11 and the vibration plate 13, a liquid storage 21 and a plurality of spaces 19 are formed by means of the reservoir plates 15. The inside of the respective spaces 19 and the liquid storage 21 are filled with the composition according to the present invention, and the spaces 19 communicate with the liquid storage 21 by means of supply ports 23.

Further, a nozzle hole 25 is provided in the nozzle plate 11 for discharging the composition in a jet-form from the spaces 19. On the other hand, a hole 27 is formed in the vibration plate 13 for supplying the composition to the liquid storage 21.

Further, on a surface of the vibration plate 13 which is opposite to the other surface that faces with the spaces 19, piezoelectric elements 29 are attached at positions corresponding to the positions of the respective spaces 19.

When the piezoelectric element 29 is energized, the piezoelectric element 29 and the vibration plate 13 are deformed, by which the volume of the space 19 is changed, so that the material for the thin film is discharged from the nozzle hole 25 toward the substrate.

In this regard, it is preferable that a water repellent treatment such as Teflon coating treatment or the like are made at the inner wall portion of the nozzle hole 25 and its peripheral part in order to prevent the bend in the jetted direction of the composition and prevent clogging of the hole by the composition.

Using the head with the above construction, it is possible to form organic EL luminescent layers respectively by discharging the compositions corresponding to, for example, the three primary colors red, blue, and green according to predetermined patterns, thereby enabling to form the pixels.

According to the ink-jet method using the ink-jet device as described above, the amount of the composition to be discharged, the number of times of the discharge and the forms of patterns can be adjusted easily and handily, so that the luminescent characteristics and film thickness and the like of the luminescent layers can be controlled.

FIG. 1 is a sectional view which shows steps performed in the embodiment of the manufacturing method for an organic EL element of the present invention.

First, pixel electrodes 101, 102 and 103 are formed on a transparent substrate 104 such as a substrate made of glass. As for examples of the forming method for these pixel electrodes, photolithography, vacuum deposition method, sputtering method and pyrosol method can be mentioned.

These pixel electrodes are preferably transparent. As for the materials constituting the transparent pixel electrodes, a tin oxide film, an ITO (indium tin oxide) film and a composite oxide film of indium oxide and zinc oxide can be mentioned.

Then, the spaces between the pixel electrodes are buried, and then banks 105 which act not only as a light cut-off layer but also an ink drop preventing wall are formed, for example, by photolithography.

Further, after coating and patterning red, green and blue compositions by jetting the above-mentioned compositions from the head 110 of the ink-jet device 109, they are undergone heat treatment under a nitrogen atmosphere to conjugate the precursors in the compositions, thereby forming luminescent layers 106 (red), 107 (green) and 108 (blue) in the form of patterns.

In addition, an electron injection and transfer layer 111 is laminated on the luminescent layers 106, 107 and 108. The electron injection and transfer layer 111 facilitates the injection of the electrons from the cathode, and contributes to the prevention of electrode quenching by keeping the luminescent portions away from the cathode to establish a better contact with the cathode. As for the electron injection and transfer layer 111, aluminum quinolynol complex to which the doping is not carried out can be used. As for other organic compounds which are capable of forming an electron injection and transfer layer, oxadiazole derivatives such as PBD, OXD-8 and the like; DSA: Bebq; triazole derivative; azomethine complex; porphyrin complex; benzoxadiazol complex; and the like can be mentioned. In this case, the electron injection and transfer layer may be formed by using any one of these compounds, or mixing or laminating two or more of these compounds.

The forming method for the electron injection and transfer layer 111 is not limited to a specific method. It is possible to form the electron injection and transfer layer 111 by using, for example, ink-jet method, vacuum deposition method, dipping method, spin coating method, casting method, capillary method, roll coating method, bar coating method or the like.

In this case, at the vicinity of the interface between the luminescent layer and the hole injection and transfer layer, a part of the materials contained in either of layers may exist in the state of mutual impregnation and diffusing into the other layer.

Then, a cathode 113 is formed, thereby the organic EL element can be obtained. In this case, it is preferred that the cathode 113 is formed into a metallic thin film electrode. As for examples of the metal for forming the cathode, Mg, Ag, Al, Li and the like can be mentioned. In addition, a material having small work function can be used for the material for the cathode 113. For example, alkali metal, alkali earth metal such as Ca and the like, and alloys containing these metals can be used.

The cathode 113 may be formed by using, for example, deposition method, sputtering method or the like.

FIG. 5 is a sectional view which shows a process of another embodiment of the manufacturing method for an organic EL element according to the present invention.

First, in the same way as the embodiment shown in FIG. 1, pixel electrodes 101, 102 and 103 are formed on a transparent substrate 104 such as a glass substrate, and then banks 105 are formed by means of photolithography.

Further, the compositions are jetted out from a head 110 for an ink-jet device 109 so that the patterns of compositions for various colors are coated and formed onto the pixel electrodes 101, 102 and 103.

After this process, a heat treatment is carried out under an nitrogen atmosphere to obtain thin films through conjugation of the precursor in each composition, and thereby patterns of the luminescent layers 106 (red) and 107 (green) are formed.

Next, as shown in the figure, a blue luminescent layer 108 is formed on the red luminescent layer 106, the green luminescent layer 107 and the pixel electrode 103. In this way, it is possible not only to form layers having the three primary colors including red, green and blue, but also to bury the level differences between the banks 105 and each of the red luminescent layer 106 and the green luminescent layer 107 so as to be flattened.

No particular limitation is imposed upon the forming method for the blue luminescent layer 108. It is possible to form the layer using the general film forming method known as deposition method or wet method, for instance, or using the ink-jet method.

The blue luminescent layer 108 can be formed of an electron injection and transfer material such as aluminum quinolynol complex. With a structure such as this, it is possible to promote the injection and transfer of the carriers so as to improve the luminous efficiency.

Further, when such a blue luminescent layer 108 is laminated with a luminescent layer formed of a hole injection and transfer material such as, for example, PPV layer or the like, it is also possible to inject and transfer efficiently the electrons and the holes from the respective electrodes into these laminated luminescent layers, thereby enabling to more improve the luminous efficiency.

Furthermore, when an electron injection and transfer layer is laminated with a hole injection and transfer layer, the function of hole injection and transfer and the function of electron injection and transfer can be assigned separately to different layers, so that optimum design can be selected for the respective materials.

As described above, when at least one organic luminescent layer for any color is formed by the ink-jet method, the luminescent layer for the other color may be formed by a different method. Therefore, even when a luminescent material which is not so suited for the ink-jet method is used, a full color organic EL element can be formed by using such a material in a combination with other organic luminescent materials that are suited for the ink-jet method, so that the latitude in the design for the EL element will be expanded.

As for examples of the forming method used for the formation of the luminescent layer other than the ink-jet method, photolithography method, vacuum deposition method, printing method, transfer method, dipping method, spin coating method, casting method, capillary method, bar coating method, roll coating method and the like can be mentioned.

Finally, a cathode (a counter electrode) 113 is formed, thereby the organic EL element is completed.

Hereinbelow, the composition for an organic EL element and the method of manufacturing an organic EL element according to the present invention are described in details with reference to the actual examples.

1. Manufacturing of Organic EL Element

EXAMPLE 1

The compositions for the organic EL element made from the compositions shown in Table 1 were prepared for respective colors, and then the organic EL element was manufactured using the compositions.

As shown in FIG. 1, on the glass substrate 104, ITO transparent pixel electrodes 101, 102 and 103 were formed by means of photolithography so as to form respectively a pattern having a pitch of 100 $\mu$m and a thickness of 0.1 $\mu$m.

Then, banks 105 made of photosensitive polyimide were formed by photolithography so as to bury the spaces between the ITO transparent pixel electrodes. In this case, each of the banks 105 was designed so as to have a width of 20 μm and a thickness of 2.0 μm, respectively.

Further, the luminescent materials for the respective colors were coated to form patterns by jetting the compositions from the head 110 of the ink-jet device 109. Then, they were undergone heat treatment under a nitrogen atmosphere at 150° C. for 4 hours to conjugate the precursors in the compositions of the materials so as to obtain thin films, thereby obtaining luminescent layers 106 (red), 107 (green) and 108 (blue) which emit red, green and blue, respectively.

Next, the vacuum deposition was carried out using the aluminum quinolynol complex to which no doping was carried out to form an electron injection and transfer layer 111 having a thickness of 0.1 μm.

Finally, an Al—Li electrode having a thickness of 0.8 μm was formed as the cathode 113 by the deposition method, thereby manufacturing the organic EL element.

EXAMPLE 2

The organic EL element was manufactured in the same way as Example 1 except that quinacridone of 0.075 wt % (ratio for solid portion of PPV precursor: 2 wt %) was added into the green luminescent layer composition as a fluorescent dye as shown in Table 2.

EXAMPLE 3

The organic EL element was manufactured in the same way as Example 1 except that rhodamine 101 was used as a fluorescent dye in the red luminescent layer composition as shown in Table 3,

EXAMPLE 4

The organic EL element was manufactured in the same way as Example 1 except that coumarin 6 of 0.00375 wt % and distyrylbiphenyl of 0.00375 wt % (ratio for solid portion of PPV precursor: 1 wt %) were used as a fluorescent dye in the blue luminescent layer composition and that glycerin of 3 wt % and diethylene glycol of 12 wt % were used as a wetting agent as shown in Table 4.

EXAMPLE 5

The organic EL element was manufactured in the same way as Example 1 except that tetraphenylbutadiene (TPB) of 0.0075 wt % (ratio for solid portion of PPV precursor: 2 wt %) was used as a fluorescent dye in the blue luminescent layer composition and quinacridone of 0.0075 wt % (ratio for solid portion of PPV precursor: 2 wt %) was used as a fluorescent dye in the green luminescent layer composition, respectively, and that glycerin of 3 wt % and diethylene glycol of 12 wt % were used as a wetting agent as shown in Table 5.

EXAMPLE 6

The organic EL element was manufactured in the same way as Example 1 except that coumarin 138 was used in the blue luminescent layer composition as a fluorescent dye as shown in Table 6.

EXAMPLE 7

The organic EL element was manufactured in the same way as Example 1 except that CN-PPV precursor which emits red color was used instead of PPV precursor and that distyrylbiphenyl of 0.0075 wt % (ratio for solid portion of PPV precursor: 2 wt %) was used as a blue fluorescent dye and quinacridone of 0.0075 wt % (ratio for solid portion of PPV precursor: 2 wt %) was used as a green fluorescent dye without adding any red fluorescent dye, as shown in Table 7.

COMPARATIVE EXAMPLE 1

As shown in Table 8, compositions for an organic EL element in which aluminum quinolynol complex (Alq$_3$) was added as a host material and in which DCM-1 (red), TPB (blue) and coumarin 6 (green) were added as a dopant, respectively, was prepared, and then the red, green and blue luminescent layers were formed using the compositions by means of vacuum deposition method to obtain an organic EL element.

COMPARATIVE EXAMPLE 2

As shown in Table 9, compositions for an EL element were prepared, in which aluminum quinolynol complex (Alq$_3$) was added as a host material, DCM-1 (red), TPB (blue) and coumarin 6 (green) were added to the respective compositions as a dopant, and wetting agent and polar solvent were also contained. Then, respective luminescent layers were formed by the ink-jet method using the compositions in the same way as Example 1 to obtain an organic EL element.

2. Evaluation of the Luminescence Characteristics and the Film Characteristics of the Luminescent Layers The luminescence characteristics and the film characteristics of the respective luminescent layers of the organic EL elements which were manufactured according to Examples 1 to 7 and Comparative Examples 1 and 2 described above were evaluated according to the following methods.

(1) Luminescence Starting Voltage

A prescribed voltage was applied to the element, and the applied voltage at which a luminance of 1 cd/m$^2$ is observed was defined as the luminescence starting voltage [Vth].

(2) Luminescence Life

The initial luminance after a stabilization treatment has been carried out was set to 100%, and the changes in the luminance of the EL element were measured under the condition that the elements were kept in continuous luminescence by supplying a constant current of standard waveform, wherein the luminescence life is defined as the time until the luminance drops to 50% of the initial luminance.

In this case, the drive conditions for this experiment were set at 40° C. for room temperature, 23% for humidity and 20 mA/cm$^2$ for current density.

(3) Luminance (Brightness)

The luminance was measured at which the current was set to 20 mA/cm$^2$.

(4) Wavelength at Maximum Absorption

The wavelength at maximum absorption for each luminescent layer was measured.

As the result of measuring the wavelength at maximum absorption for the respective luminescent layers of the organic EL elements obtained in Examples 2 to 7, the same results were obtained.

(5) Stability in Film Formation

After heating the luminescent layer at 200° C. for 60 minutes, conditions for occurrence of defects such as cracks and deformation in the respective luminescent layers were observed by a microscope.

The results of the evaluation are shown in Table 10 and Table 11.

As indicated in Table 10 and Table 11, the luminescent layers in Examples 1 to 7 have excellent luminescence characteristics and excellent film characteristics.

In contrast with these Examples, the stability in film formation of the luminescent layer in Comparative Example 1 was poor, and a dark spot was observed in the luminescent layer. Further, for the luminescent layer in Comparative Example 2, an erosion of the material constituting the head which is caused by chloroform as the solvent was observed. Furthermore, it was impossible to complete the formation of the pattern due to the clogging of the nozzle beings caused. This is because chloroform tended to vapor due to its lower boiling point so that a dry luminescent layer material was gathered at and then adhered to the nozzle hole and the periphery thereof to cause the clogging of the nozzle.

3. Evaluation of the Physical Properties and the Discharging Characteristics of the compositions

EXAMPLE 8

A composition for the organic EL element having compositions shown in Table 12 was prepared, and then the composition for the organic EL element was discharged from the nozzle of the ink-jet device in the same way as Example 1 to carry out the coating and the pattern formation.

Then, they were undergone heat treatment under a nitrogen atmosphere at 150° C. for 4 hours to conjugate the precursors in the compositions and to obtain a thin film, which forms the red luminescent layer.

EXAMPLE 9

The blue luminescent layer was formed in the same way as Example 8 except that distyrylbiphenyl was used as a blue fluorescent dye instead of the rhodamine B as shown in Table 13.

EXAMPLE 10

The green luminescent layer was formed in the same way as Example 8 except that quinacridone was used as a green fluorescent dye instead of the rhodamine B as shown in Table 14.

EXAMPLE 11

The blue luminescent layer was formed in the same way as Example 8 except that coumarin 6 was used as a blue fluorescent dye instead of the rhodamine B and that the amount of glycerin and diethylene glycol to be added as a wetting agent was changed as shown in Table 15.

EXAMPLE 12

The blue luminescent layer was formed in the same way as Example 8 except that TPB (tetraphenylbutadiene) was used as a blue fluorescent dye instead of the rhodamine as shown in Table 16.

EXAMPLE 13

The green luminescent layer was formed in the same way as Example 8 except that CN-PPV precursor which emits red color was used instead of PPV precursor, and that quinacridone of 0.0075 wt % was added as a green fluorescent dye as shown in Table 17.

COMPARATIVE EXAMPLE 3

The green luminescent layer was formed in the same way as Example 8 except that a composition which includes aqueous solution of PPV precursor of 50 wt %; glycerin of 20 wt % and diethylene glycol of 20 wt % for wetting agents; and DMF of 10 wt % for polar solvent; and quinacridone as a green fluorescent dye instead of the rhodamine B were used, as shown in Table 18.

COMPARATIVE EXAMPLE 4

The blue luminescent layer was formed in the same way as Example 8 except that coumarin 6 was used as a blue fluorescent dye instead of rhodamine B, that DMF of 75 wt % was used as a polar solvent, and that no wetting agent was added, as shown in Table 19.

COMPARATIVE EXAMPLE 5

The red luminescent layer was formed in the same way as Example 8 except that a composition which includes aqueous solution of PPV precursor of 50 wt %; glycerin of 10 wt % and diethylene glycol of 10 wt % for wetting agents; and DMF of 30 wt % for polar solvent was used as shown in Table 20.

4. Evaluation of Physical Properties and Discharge Characteristic of the Composition The contact angle, viscosity and surface tension of the compositions of Examples 8 to 13 and Comparative Examples 3 to 5 were measured.

In addition, the occurrence frequency of the bend in the jetted direction of the composition and the occurrence frequency of clogging of the nozzle hole at the time of discharging the composition from the nozzle hole of an ink-jet printer (made by EPSON Co., Ltd. Model No. MJ-500C, the material constituting the nozzle surface is a water repellent layer to which eutectic tetrafluoroethylene-nickel is plated) were also investigated.

(1) Contact Angle

The contact angle for each composition with respect to the material constituting the nozzle surface was measured in accordance with the measurement method of the contact angle as stipulated in JIS K3211.

(2) Viscosity

The viscosity of each composition at 20° C. was measured using Type E viscometer.

(3) Surface Tension

For the surface tension "γ" of each composition, the measurement was carried out by means of the drip method as follows.

When a liquid is dripped gently from the mouth of a circular tube with flat cut plane, a droplet falls as its weight overcomes the surface tension. If the mass of the droplet is called "m", the force pulling it downward is "mg", and the force pulling it upward is $2\pi r\gamma$ ("r" is the outer radius of the mouth of the pipe). Based on the relationship between the two forces, the surface tension "γ" of the composition was determined by measuring "m".

(4) Occurrence Frequency of Bend in Jetted Direction

When the composition was continuously discharged (at a frequency of 7200 Hz), a time required until the bend in the jetted direction occurred was measured.

(5) Occurrence Frequency of Clogging of Nozzle Hole

When the composition was continuously discharged (at a frequency of 7200 Hz), a time required until the nozzle hole was leaded to be impossible to discharge the composition because of the clogging of the nozzle hole by the precipitated solid component of the composition, was measured.

The results of these experiments are shown in Table 21.

As shown in Table 21, each of the compositions in Examples 8 to 13 has markedly lower values of the occurrence frequency of the bend in the jetted direction and the occurrence frequency of the clogging of the nozzle hole in comparison with those of Comparative Examples, and the occurrence frequencies indicated by the values were within the range of the practical level.

In particular, when all of the characteristics including the contact angle, the viscosity and the surface tension of the compositions fall within the ranges specified by this invention, the occurrence frequency of the bend in the jetted direction and the occurrence frequency of the clogging of the nozzle hole were low level, so that it was found that they were extremely excellent compositions.

In contrast, when the composition in Comparative Example 3 was discharged, the occurrence frequency of the bend in the jetted direction and the occurrence frequency of the clogging of the nozzle hole were high level since the composition of Comparative Example 3 has a tendency that the solid component in the composition is likely to stick at the periphery of the nozzle hole, so that it was found this composition can not be practically used.

The composition in Comparative Example 4 has a large value for the occurrence frequency of the bend in the jetted direction, so that it was found that it is not suitable for fine pattern formation.

Further, for the composition in Comparative Example 5, the clogging of the nozzle occurred in a short time as soon as the discharge of the composition was started, so that it could hardly discharge the composition.

5. Formation of Organic EL Element

Then, by carrying out a vacuum deposition of aluminum quinolynol complex to which no doping was carried out, the electron injection and transfer layer 111 having a thickness of 0.1 $\mu$m was laminated on the luminescent layers which were formed of the respective compositions in Examples 8 to 13.

Finally, an Al—Li electrode having a thickness of 0.8 $\mu$m was formed as the cathode 113, respectively, by the deposition method, and thereby manufacturing the organic EL elements.

6. Evaluation of Luminescent Characteristics and Film Properties of the Luminescent Layer The luminescent characteristics and the film properties of the luminescent layers formed from the compositions of Examples 8 to 13 were evaluated by the same methods as described above with reference to the description "2. Evaluation of Luminescent Characteristics and Film Properties of the Luminescent Layer".

The results of these evaluations are shown in Table 22.

As can be seen from Table 22, the luminescent characteristics and the film properties of all of the luminescent layers formed using the compositions of Examples 8 to 13 were excellent. Namely, it was possible to obtain organic EL elements free from dark spots and have high luminance and long life.

In the above, the compositions for the organic EL element and the methods of manufacturing the organic EL elements have been described for respective embodiments illustrated. However, the present invention is not limited to these embodiments. Namely, in the method of manufacturing the organic EL element, it may further includes a step of inserting arbitrary intermediate layers such as a carrier transporting layer or a buffer layer between the layers. As for the buffer layer, 1,2,4-triazole (TAZ) derivative and the like can be mentioned, which is effective for improving the luminance and the luminescence life.

Further, the method may further include a step in which surface treatment such as plasma treatment, UV treatment, coupling or the like are applied to surfaces of pixel electrode, an underlying layer and the like in order to facilitate the sticking of the EL materials. Further, the method may further include a step of forming a protective layer on the cathode.

Furthermore, the material constituting the nozzle surface of the ink-jet device is not limited to those of the embodiments described above.

Moreover, in the composition for the organic EL element of the present invention, the fluorescent dye to be added for changing the luminescent characteristics is not limited to those of the embodiments as long as they can be dissolved and dispersed homogeneously into a solvent.

As described in the above, according to the compositions for the organic EL element of the present invention, a rational design of the organic EL element is possible through wide ranging selection of luminescent materials. In particular, when the composition for the organic EL element includes a precursor of a conjugated polymer based organic compound and a fluorescent dye, it is possible to manufacture an organic EL element which realizes a full color display since various kinds of luminescent layers can be obtained through the selection of various materials. In addition, it is possible to develop designs for various organic EL elements with high luminance and long life.

Further, since conditions for a composition, such as contact angle, viscosity and surface tension can be freely set, the conditions suitable as a discharge liquid for the ink-jet method can be easily adjusted.

According to the method of manufacturing the organic EL element, it is possible to employ the ink-jet method to the formation of a luminescent layer, a hole injection and transfer layer, and an electron injection and transfer layer. In that case, it is possible to carry out easily a high precise pattern formation in a short time without the occurrence of the bend in the jetted direction of a discharge liquid and the occurrence of the clogging of the nozzle hole. In addition, the optimizations of the film design and the luminescent characteristics can be readily achieved, thereby enabling to form a luminescent layer and an EL layer which are capable of easy adjustment of luminescence efficiency and have excellent durability.

Further, according to the ink-jet method, conditions such as the film thickness, the number of dots and the like can be adjusted arbitrarily, so that the size and the pattern of the luminescent element can also be set arbitrarily.

Furthermore, according to the ink-jet method, the element can be formed without being restrained by the dimensions of the substrate and the like since the head can be moved freely. Moreover, since required amounts of materials can be arranged at required locations, it is possible to maximally exclude the uselessness of waste liquid and the like.

Finally, it is to be understood that the composition for to organic EL element according to the present invention is not limited to the embodiments described above, and it is possible to make various changes and additions without departing from the scope and spirit of the present invention as defined in the appended claims.

TABLE 1

(Example 1)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 5 | Wetting Agent | glycerin | 5 | Wetting Agent | glycerin | 5 |
| | diethyleneglycol | 10 | | diethyleneglycol | 10 | | diethyleneglycol | 10 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine B | 0.0075 (Ratio of Solid Portion of Precursor: 2 wt %) | Fluorescent Dye | distyryl-biphenyl | 0.0075 (Ratio of Solid Portion of Precursor: 2 wt %) | Fluorescent Dye | Without Fluorescent Dye | — |

TABLE 2

(Example 2)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 5 | Wetting Agent | glycerin | 5 | Wetting Agent | glycerin | 5 |
| | diethyleneglycol | 10 | | diethyleneglycol | 10 | | diethyleneglycol | 10 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine B | 0.0075 (Ratio of Solid Portion of Precursor: 2 wt %) | Fluorescent Dye | distyryl-biphenyl | 0.0075 (Ratio of Solid Portion of Precursor: 2 wt %) | Fluorescent Dye | quinacridone | 0.0075 (Ratio of Solid Portion of Precursor: 2 wt %) |

TABLE 3

(Example 3)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 5 | Wetting Agent | glycerin | 5 | Wetting Agent | glycerin | 5 |
| | diethyleneglycol | 10 | | diethyleneglycol | 10 | | diethyleneglycol | 10 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine 101 | 0.0075 (Ratio of Solid Portion of Precursor: 2 wt %) | Fluorescent Dye | distyryl-biphenyl | 0.0075 (Ratio of Solid Portion of Precursor: 2 wt %) | Fluorescent Dye | Without Fluorescent Dye | — |

TABLE 4

(Example 4)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 3 | Wetting Agent | glycerin | 3 | Wetting Agent | glycerin | 3 |
| | diethylene-glycol | 12 | | diethylene-glycol | 12 | | diethylene-glycol | 12 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine B | 0.0075 (Ratio of Solid Portion of Precursor: 2 wt %) | Fluorescent Dye | coumarin 6 distyryl-biphenyl | 0.00375 (1 wt %) 0.00375 (1 wt %) | Fluorescent Dye | Without Fluorescent Dye | — |

TABLE 5

(Example 5)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 3 | Wetting Agent | glycerin | 3 | Wetting Agent | glycerin | 3 |
| | diethylene-glycol | 12 | | diethylene-glycol | 12 | | diethylene-glycol | 12 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine B | 0.0075 (Ratio of Solid Portion of Precursor: 2 wt %) | Fluorescent Dye | TPB tetraphenyl-butadiene | 0.0075 (Ratio of Solid Portion of Precursor: 2 wt %) | Fluorescent Dye | quinacridone | 0.0075 (Ratio of Solid Portion of Precursor: 2 wt %) |

TABLE 6

(Example 6)

| | Red Luminescent Layer | | | Blue Luminescent Layer | | | Green Luminescent Layer | |
|---|---|---|---|---|---|---|---|---|
| | Composition | Amount of Content (wt %) | | Composition | Amount of Content (wt %) | | Composition | Amount of Content (wt %) |
| Precursor | PPV-precursor | 0.375 | Precursor | PPV-precursor | 0.375 | Precursor | PPV-precursor | 0.375 |
| Wetting Agent | glycerin | 5 | Wetting Agent | glycerin | 5 | Wetting Agent | glycerin | 5 |
| | diethylene-glycol | 10 | | diethylene-glycol | 10 | | diethylene-glycol | 10 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | rhodamine B | 0.0075 (Ratio of Solid Portion of Precursor: 2 wt %) | Fluorescent Dye | coumarin 138 | 0.0075 (Ratio of Solid Portion of Precursor: 2 wt %) | Fluorescent Dye | Without Fluorescent Dye | — |

TABLE 7

(Example 7)

| Red Luminescent Layer | | | Blue Luminescent Layer | | | Green Luminescent Layer | | |
|---|---|---|---|---|---|---|---|---|
| | Composition | Amount of Content (wt %) | | Composition | Amount of Content (wt %) | | Composition | Amount of Content (wt %) |
| Precursor | CN-PPV-precursor | 0.375 | Precursor | CN-PPV-precursor | 0.375 | Precursor | CN-PPV-precursor | 0.375 |
| Wetting Agent | glycerin | 5 | Wetting Agent | glycerin | 5 | Wetting Agent | glycerin | 5 |
| | diethylene-glycol | 10 | | diethylene-glycol | 10 | | diethylene-glycol | 10 |
| Polar Solvent | water | 1.231 | Polar Solvent | water | 1.231 | Polar Solvent | water | 1.231 |
| | methanol | 23.394 | | methanol | 23.394 | | methanol | 23.394 |
| | DMF | 60 | | DMF | 60 | | DMF | 60 |
| Fluorescent Dye | Without Fluorescent Dye | — | Fluorescent Dye | distyryl-biphenyl | 0.0075 (Ratio of Solid Portion of Precursor: 2 wt %) | Fluorescent Dye | quinacridone | 0.0075 (Ratio of Solid Portion of Precursor: 2 wt %) |

TABLE 8

(Comp. Ex. 1)

| Red Luminescent Layer | | | Blue Luminescent Layer | | | Green Luminescent Layer | | |
|---|---|---|---|---|---|---|---|---|
| | Composition | Amount of Content (wt %) | | Composition | Amount of Content (wt %) | | Composition | Amount of Content (wt %) |
| Host | Alq$_2$ | 99.0 | Host | Alq$_2$ | 82.1 | Host | Alq$_2$ | 98.95 |
| Dopant | DCM-1 | 1.0 | Dopant | TPB | 17.9 | Dopant | coumarin 6 | 1.05 |
| Wetting Agent | — | — | Wetting Agent | — | — | Wetting Agent | — | — |
| Polar Solvent | — | — | Polar Solvent | — | — | Polar Solvent | — | — |

TABLE 9

(Comp. Ex. 2)

| Red Luminescent Layer | | | Blue Luminescent Layer | | | Green Luminescent Layer | | |
|---|---|---|---|---|---|---|---|---|
| | Composition | Amount of Content (wt %) | | Composition | Amount of Content (wt %) | | Composition | Amount of Content (wt %) |
| Host | Alq$_2$ | 24.0 | Host | Alq$_2$ | 7.1 | Host | Alq$_2$ | 23.95 |
| Dopant | DCM-1 | 1.0 | Dopant | TPB | 17.9 | Dopant | coumarin 6 | 1.05 |
| Wetting Agent | glycerin | 5 | Wetting Agent | glycerin | 5 | Wetting Agent | glycerin | 5 |
| | DEG | 10 | | DEG | 10 | | DEG | 10 |
| Polar Solvent | chloroform | 10 | Polar Solvent | chloroform | 10 | Polar Solvent | chloroform | 10 |
| | DMF | 50 | | DMF | 50 | | DMF | 50 |

TABLE 10

| | Luminescence Starting Voltage [$V_{th}$] | | | Luminescence Life [hr] | | | Luminance [cd/m$^2$] | | | Wavelength at Maximum Absorption [nm] | | |
|---|---|---|---|---|---|---|---|---|---|---|---|---|
| | R | G | B | R | G | B | R | G | B | R | G | B |
| Example 1 | 3 | 3 | 5 | 5000 | 5000 | 5000 | 2000 | 2000 | 2000 | 590 | 530 | 420 |
| Example 2 | 4 | 3 | 5 | 5000 | 5000 | 5000 | 2000 | 2000 | 2000 | 600 | 530 | 410 |
| Example 3 | 4 | 3 | 6 | 5000 | 5000 | 5000 | 2000 | 2000 | 2000 | 620 | 530 | 420 |
| Example 4 | 4 | 3 | 5 | 5000 | 5000 | 5000 | 2000 | 2000 | 2000 | 620 | 530 | 415 |
| Example 5 | 4 | 3 | 5 | 5000 | 5000 | 5000 | 2000 | 2000 | 2000 | 590 | 525 | 420 |
| Example 6 | 4 | 3 | 5 | 5000 | 5000 | 5000 | 2000 | 2000 | 2000 | 590 | 530 | 420 |
| Example 7 | 4 | 4 | 5 | 5000 | 5000 | 5000 | 2000 | 2000 | 2000 | 620 | 530 | 430 |
| Comp. Ex. 1 | 10 | 10 | 10 | 1000 | 1000 | 1000 | 1400 | 1200 | 1000 | 550 | 510 | 450 |
| Comp. Ex. 2 | Impossible to form pattern | | | | | | | | | | | |

TABLE 11

Stability in Film Formation

|  | R | G | B |
| --- | --- | --- | --- |
| Example 1 | ⊚ | ⊚ | ⊚ |
| Example 2 | ⊚ | ⊚ | ⊚ |
| Example 3 | ⊚ | ⊚ | ⊚ |
| Example 4 | ⊚ | ⊚ | ⊚ |
| Example 5 | ⊚ | ⊚ | ⊚ |
| Example 6 | ⊚ | ⊚ | ⊚ |
| Example 7 | ⊚ | ⊚ | ⊚ |
| Comp. Ex. 1 | ○ | Δ | x |
| Comp. Ex. 2 | Impossible to form pattern | | |

TABLE 12

(Example 8)

| Composition | Name of Material | Amount of Content (wt %) |
| --- | --- | --- |
| Precursor | aqueous solution of PPV precursor (1.5 wt %) (mixed solution of water/methanol = 5/95) | 25 |
| Wetting Agent | glycerin | 5 |
|  | diethylene glycol | 10 |
| Polar Solvent | DMF (N,N-dimethyl formamide) | 60 |
| Fluorescent Dye | rhodamine B | 0.0075 (Ratio of Solid Portion of Precursor 2 wt %) |

TABLE 13

(Example 9)

| Composition | Name of Material | Amount of Content (wt %) |
| --- | --- | --- |
| Precursor | aqueous solution of PPV precursor (1.5 wt %) (mixed solution of water/methanol = 5/95) | 25 |
| Wetting Agent | glycerin | 5 |
|  | diethylene glycol | 10 |
| Polar Solvent | DMF (N,N-dimethyl formamide) | 60 |
| Fluorescent Dye | distyrylbiphenyl | 0.0075 (Ratio of Solid Portion of Precursor 2 wt %) |

TABLE 14

(Example 10)

| Composition | Name of Material | Amount of Content (wt %) |
| --- | --- | --- |
| Precursor | aqueous solution of PPV precursor (1.5 wt %) (mixed solution of water/methanol = 5/95) | 25 |
| Wetting Agent | glycerin | 5 |
|  | diethylene glycol | 10 |
| Polar Solvent | DMF (N,N-dimethyl formamide) | 60 |
| Fluorescent Dye | quinacridone | 0.0075 (Ratio of Solid Portion of Precursor 2 wt %) |

TABLE 15

(Example 11)

| Composition | Name of Material | Amount of Content (wt %) |
| --- | --- | --- |
| Precursor | aqueous solution of PPV precursor (1.5 wt %) (mixed solution of water/methanol = 5/95) | 25 |
| Wetting Agent | glycerin | 3 |
|  | diethylene glycol | 12 |
| Polar Solvent | DMF (N,N-dimethyl formamide) | 60 |
| Fluorescent Dye | coumarin 6 | 0.0075 (Ratio of Solid Portion of Precursor 2 wt %) |

TABLE 16

(Example 12)

| Composition | Name of Material | Amount of Content (wt %) |
| --- | --- | --- |
| Precursor | aqueous solution of PPV precursor (1.5 wt %) (mixed solution of water/methanol = 5/95) | 25 |
| Wetting Agent | glycerin | 5 |
|  | diethylene glycol | 10 |
| Polar Solvent | DMF (N,N-dimethyl formamide) | 60 |
| Fluorescent Dye | TBP (tetraphenylbutadiene) | 0.0075 (Ratio of Solid Portion of Precursor 2 wt %) |

TABLE 17

(Example 13)

| Composition | Name of Material | Amount of Content (wt %) |
| --- | --- | --- |
| Precursor | aqueous solution of CN-PPV precursor (1.5 wt %) (mixed solution of water/methanol = 5/95) | 25 |
| Wetting Agent | glycerin | 5 |
|  | diethylene glycol | 10 |
| Polar Solvent | DMF (N,N-dimethyl formamide) | 60 |
| Fluorescent Dye | quinacridone | 0.0075 (Ratio of Solid Portion of Precursor 2 wt %) |

TABLE 18

(Comp. Ex. 3)

| Composition | Name of Material | Amount of Content (wt %) |
| --- | --- | --- |
| Precursor | aqueous solution of PPV precursor (1.5 wt %) (mixed solution of water/methanol = 5/95) | 50 |

TABLE 18-continued (Comp. Ex. 3)

| Composition | Name of Material | Amount of Content (wt %) |
|---|---|---|
| Wetting Agent | glycerin | 20 |
|  | diethylene glycol | 20 |
| Polar Solvent | DMF (N,N-dimethyl formamide) | 10 |
| Fluorescent Dye | quinacridone | 0.0075 (Ratio of Solid Portion of Precursor 1 wt %) |

TABLE 19

(Comp. Ex. 4)

| Composition | Name of Material | Amount of Content (wt %) |
|---|---|---|
| Precursor | aqueous solution of PPV precursor (1.5 wt %) (mixed solution of water/methanol = 5/95) | 25 |
| Wetting Agent | glycerin | 0 |
|  | diethylene glycol | 0 |
| Polar Solvent | DMF (N,N-dimethyl formamide) | 75 |

TABLE 19-continued (Comp. Ex. 4)

| Composition | Name of Material | Amount of Content (wt %) |
|---|---|---|
| Fluorescent Dye | coumarin 6 | 0.0075 (Ratio of Solid Portion of Precursor 2 wt %) |

TABLE 20

(Comp. Ex. 5)

| Composition | Name of Material | Amount of Content (wt %) |
|---|---|---|
| Precursor | aqueous solution of PPV precursor (1.5 wt %) (mixed solution of water/methanol = 5/95) | 50 |
| Wetting Agent | glycerin | 10 |
|  | diethylene glycol | 10 |
| Polar Solvent | DMF (N,N-dimethyl formamide) | 30 |
| Fluorescent Dye | rhodamine B | 0.0075 (Ratio of Solid Portion of Precursor 1 wt %) |

TABLE 21

(Result of Experiment)

| Composition | Viscosity [cp] | Surface Tension [dyne/cm] | Contact Angle [°] | Occurrence Frequency of Bend in Jetted Direction (sec) | Occurence Frequency of Clogging (sec) |
|---|---|---|---|---|---|
| Example 8 | 3.72 | 32.9 | 59 | 3.000 | more than 10.000 |
| Example 9 | 3.60 | 30.1 | 60 | 2.800 | more than 10.000 |
| Example 10 | 3.62 | 39.6 | 40 | 2.800 | more than 10.000 |
| Example 11 | 2.80 | 31.6 | 38 | 2.900 | more than 10.000 |
| Example 12 | 3.58 | 33.2 | 36 | 3.000 | 9.000 |
| Example 13 | 3.86 | 33.6 | 64 | 2.800 | 9.000 |
| Comp. Ex. 3 | 30.3 | 18.5 | 20 | 100 | 1.000 |
| Comp. Ex. 4 | 0.9 | 90 | 175 | 200 | more than 10.000 |
| Comp. Ex. 5 | 25 | 15 | 28 | Impossible to discharge composition |  |

TABLE 22

| | Luminescence Starting Voltage [$V_{th}$] | Luminescence Life [hr] | Luminance [$cd/m^2$] | Wavelength at Maximum Absorption [nm] | Stability in Film Formation |
|---|---|---|---|---|---|
| Example 8 | 3.0 | 5000 | 2000 | 620 | ⊙ |
| Example 9 | 4.5 | 4900 | 1800 | 420 | ⊙ |
| Example 10 | 4.2 | 4800 | 1700 | 530 | ⊙ |
| Example 11 | 4.3 | 4900 | 1900 | 480 | ⊙ |
| Example 12 | 4.0 | 4800 | 1900 | 430 | ⊙ |
| Example 13 | 5.6 | 4500 | 1850 | 530 | ⊙ |

What is claimed is:

1. A composition for forming an organic EL element having a luminescent layer having a certain color, the composition comprising:
   a precursor of a conjugated polymer compound; and
   a fluorescent dye,
   the composition is capable of forming the luminescent layer comprising a mixture of the conjugated polymer compound and the fluorescent dye, and
   the mixture determining a luminescence characteristic of the luminescent layer.

2. The composition for forming an organic EL element as claimed in claim 1, wherein said luminescent layer is formed from a pattern of the composition which is formed by an ink-jet method.

3. The composition for forming an organic EL element as claimed in claim 2, wherein the inkjet method uses an ink-jet device having a nozzle with a nozzle hole for discharging the composition, in which the composition contains a wetting agent for preventing the composition from being dried and solidified at the nozzle of the ink-jet device.

4. The composition for forming an organic EL element as claimed in claim 1, wherein the conjugated polymer compound is a hole injection and transfer material.

5. The composition for forming an organic EL element as claimed in claim 1, wherein the precursor of the conjugated polymer compound includes a polyarylene vinylene precursor.

6. The composition for forming an organic EL element as claimed in claim 5, wherein the polyarylene vinylene precursor includes a precursor of a polyparaphenylene vinylene or a polyparaphenylene vinylene derivative.

7. The composition for forming an organic EL element as claimed in claim 1, wherein the fluorescent dye includes rhodamine or rhodamine derivative.

8. The composition for forming an organic EL element as claimed in claim 1, wherein the fluorescent dye includes distyrylbiphenyl or distyrylbiphenyl derivative.

9. The composition for forming an organic EL element as claimed in claim 1, wherein the fluorescent dye includes coumarin or coumarin derivative.

10. The composition for forming an organic EL element as claimed in claim 1, wherein the fluorescent dye includes tetraphenylbutadiene (TPB) or tetraphenylbutadiene derivative.

11. The composition for forming an organic EL element as claimed in claim 1, wherein the fluorescent dye includes quinacridone or quinacridone derivative.

12. The composition for forming an organic EL element as claimed in claim 1, wherein the precursor of the conjugated polymer compound and the fluorescent dye exist in the state of being dissolved or dispersed into a polar solvent.

13. The composition for forming an organic EL element as claimed in claim 1, wherein the amount of the fluorescent dye is 0.5 to 10 wt % with respect to a solid component of the precursor of the conjugated polymer compound.

14. The composition for forming the organic EL element as claimed in claim 1, wherein a viscosity of the composition for the organic EL element is 1 to 20 cp.

15. The composition for forming the organic EL element as claimed in claim 1, wherein a surface tension of the composition for the organic EL element is 20 to 70 dyne/cm.

16. A method of manufacturing an organic EL element, comprising the steps of:
    coating a pattern by discharging the composition of claim 1 from a head by an ink-jet method; and
    forming at least one luminescent layer for a certain color by conjugating the precursor of the conjugated organic polymer compound.

17. The method of manufacturing the organic EL element as claimed in claim 16, wherein the luminescence characteristic is a maximum wavelength of light absorption.

18. The method of manufacturing the organic EL element as claimed in claim 16, wherein the conjugated organic polymer compound is a hole injection and transfer material.

19. The method of manufacturing the organic EL element as claimed in claim 16, wherein the precursor of the conjugated organic polymer compound includes a precursor of a polyarylene vinylene.

20. The method of manufacturing the organic EL element as claimed in claim 19, wherein the polyarylene vinylene precursor includes a precursor of a polyparaphenylene vinylene or a polyparaphenylene vinylene derivative.

21. The method of manufacturing the organic EL element as claimed in claim 16, wherein the fluorescent dye includes rhodamine or rhodamine derivative.

22. The method of manufacturing the organic EL element as claimed in claim 16, wherein the fluorescent dye includes distyrylbiphenyl or distyrylbiphenyl derivative.

23. The method of manufacturing the organic EL element as claimed in claim 16, wherein the fluorescent dye includes coumarin or coumarin derivative.

24. The method of manufacturing the organic EL element as claimed in claim 16, wherein the fluorescent dye includes tetraphenylbutadiene (TPB) or tetraphenylbutadiene derivative.

25. The method of manufacturing the organic EL element as claimed in claim 16, wherein the fluorescent dye includes quinacridone or quinacridone derivative.

26. The method of manufacturing the organic EL element as claimed in claim 16, wherein a contact angle with respect to a material constituting a nozzle surface of a nozzle of a device used for the ink-jet method for discharging the composition lies in the range of 30 to 170 degrees.

27. The method of manufacturing the organic EL element as claimed in claim 16, wherein a viscosity of the composition for the organic EL element is 1 to 20 cp.

28. The method of manufacturing the organic EL element as claimed in claim 16, wherein a surface tension of the composition for the organic EL element is 20 to 70 dyne/cm.

* * * * *